(12) United States Patent
Chae

(10) Patent No.: US 7,920,246 B2
(45) Date of Patent: Apr. 5, 2011

(54) LCD DEVICE INCLUDING SEMICONDUCTOR OF NANO MATERIAL AND METHOD FOR FABRICATING THE SAME

(75) Inventor: Gee Sung Chae, Incheon-kwangyokshi (KR)

(73) Assignee: LG Display Co., Ltd., Seoul (KR)

( * ) Notice: Subject to any disclaimer, the term of this patent is extended or adjusted under 35 U.S.C. 154(b) by 894 days.

(21) Appl. No.: 11/286,951

(22) Filed: Nov. 22, 2005

(65) Prior Publication Data

US 2007/0001169 A1 Jan. 4, 2007

(30) Foreign Application Priority Data

Jun. 30, 2005 (KR) .................. 10-2005-0058412

(51) Int. Cl.
*G02F 1/136* (2006.01)
*B05D 5/12* (2006.01)
*H01L 21/00* (2006.01)
*G02F 1/13* (2006.01)

(52) U.S. Cl. ............ 349/187; 349/43; 438/149; 427/58

(58) Field of Classification Search .................. None
See application file for complete search history.

(56) References Cited

U.S. PATENT DOCUMENTS

| 6,411,346 B1 * | 6/2002 | Numano et al. ............... 349/39 |
| 2001/0001288 A1 * | 5/2001 | Tomoyori et al. ............... 430/7 |
| 2001/0023046 A1 * | 9/2001 | Nihei ............................. 430/51 |
| 2006/0134392 A1 * | 6/2006 | Hantschel et al. ............ 428/210 |
| 2006/0211183 A1 * | 9/2006 | Duan et al. .................... 438/149 |

* cited by examiner

*Primary Examiner* — Mark A Robinson
*Assistant Examiner* — Michael P Mooney
(74) *Attorney, Agent, or Firm* — Brinks Hofer Gilson & Lione

(57) ABSTRACT

An LCD device and a method for fabricating the same are disclosed. The LCD device includes a substrate having a pixel region. A gate electrode is formed in the pixel region. A gate insulating film is formed on the substrate including the gate electrode. A conducting layer is formed on the substrate including the gate insulating film. A semiconductor layer containing a nanosemiconductor material is formed on the conducting layer above the gate electrode. Source and drain electrodes overlap opposing sides of the semiconductor layer. A passivation layer is formed on the substrate including the source and drain electrodes. A first contact hole in the passivation layer exposes the drain electrode. A pixel electrode in the pixel region is connected to the drain electrode through the first contact hole.

5 Claims, 12 Drawing Sheets

LCD DEVICE INCLUDING SEMICONDUCTOR OF NANO MATERIAL AND METHOD FOR FABRICATING THE SAME

This application claims the benefit of the Korean Patent Application No. P2005-0058412, filed on Jun. 30, 2005, which is hereby incorporated by reference as if fully set forth herein.

TECHNICAL FIELD

The present invention relates to a liquid crystal display (LCD) device, and more particularly, to an LCD device and a method for fabricating the same, in which a nanomaterial is used as a material of a semiconductor layer.

DISCUSSION OF THE RELATED ART

The demands for various display devices has increased with the development of an information-based society. Accordingly, much effort has been expended to research and develop various flat display devices such as a liquid crystal display (LCD), a plasma display panel (PDP), an electroluminescent display (ELD), and a vacuum fluorescent display (VFD). Some of these flat display devices have already been applied to displays for various equipment.

Among the various flat display devices, liquid crystal display (LCD) devices have been most widely used as they have high picture quality, thin profile, lightness in weight, and low power consumption. The LCD devices thus provide a substitute for a Cathode Ray Tube (CRT) display. In addition to mobile type LCD devices such as a display for a notebook computer, LCD devices have been developed for computer monitors and televisions to receive and display broadcast signals.

Despite various technical developments in the LCD technology having applications in different fields, research in enhancing the picture quality of the LCD device has been, in some respects, lacking as compared to other features and advantages of the LCD device.

In order to use LCD devices in various fields as a general display, increasing the picture quality of the LCD devices is desirable. Display of a high quality picture includes the LCD having high resolution and high luminance with a large-sized screen, while still maintaining lightness in weight, thin profile, and low power consumption.

The LCD device includes an LCD panel for displaying images, and a driver for applying a driving signal to the LCD panel. The LCD panel includes first and second substrates bonded to each other with a predetermined space therebetween, and a liquid crystal layer formed between the first and second substrates by injection.

The first substrate (TFT array substrate) includes a plurality of gate lines arranged along a first direction at fixed intervals, a plurality of data lines arranged along a second direction perpendicular to the first direction at fixed intervals, a plurality of pixel electrodes formed in a matrix at pixel regions where the gate lines cross the data lines, and a plurality of thin film transistors switched by signals of the gate lines to transfer signals of the data lines to each pixel electrode.

The second substrate (color filter substrate) includes a black matrix layer that prevents transmission of light through portions other than the pixel regions, R/G/B color filter layers for displaying various colors, and a common electrode for producing the image.

A method for forming a semiconductor layer of the TFT provided in the first substrate will be described.

FIG. 1A to FIG. 1E are sectional views illustrating process steps of forming a semiconductor layer of a thin film transistor provided in a related art LCD device.

As shown in FIG. 1A, a substrate 100 is prepared, and a metal is deposited on an entire surface of the substrate 100. The metal is then selectively patterned by a photolithographic process to form a gate line and a gate electrode GE extending from the gate line.

Subsequently, a gate insulating film GI is deposited on the entire surface of the substrate 100 including the gate line and the gate electrode GE.

As shown in FIG. 1B, an unintentionally doped semiconductor material 101a and a doped semiconductor material 102a are sequentially deposited, and a photoresist PR is coated on the entire surface of the doped semiconductor material 102a.

Next, as shown in FIG. 1C, a mask M having a pattern for the semiconductor layer is aligned above the substrate 100 in which the photoresist PR is formed. Ultraviolet rays irradiate the photoresist PR through the mask M.

The ultraviolet rays pass through an opening portion m1 of the mask M and are shielded by a shielding portion m2. Therefore, the ultraviolet rays irradiate only the photoresist PR corresponding to the opening portion m1.

Afterwards, as shown in FIG. 1D, some of the photoresist PR, i.e., a portion irradiated by the ultraviolet rays, is selectively patterned by a developing process.

Subsequently, the doped semiconductor material 102a and the unintentionally doped semiconductor material 101a are etched using the patterned photoresist PR as a mask. The patterned photoresist PR is then removed. Thus, as shown in FIG. 1E, a semiconductor layer 101 and an ohmic contact layer 102 are formed.

In the related art method for fabricating the LCD device, various processes steps are performed to form the semiconductor layer 101. These steps include depositing the semiconductor material 101a, forming the photoresist PR on the semiconductor material 101a, exposing and developing the photoresist PR to form a photoresist pattern, and etching the exposed portion of the semiconductor material 101a using the photoresist pattern as a mask M. The aforementioned steps use various pieces of process equipment. As multiple steps are used to fabricate the overall device, the process is long and relatively complex. Also, since multiple pieces of process equipment are used in the process steps, the equipment cost is relatively large.

SUMMARY

By way of introduction only, in one embodiment an LCD device includes a substrate having a pixel region; a gate electrode in the pixel region; a gate insulating film on the substrate; a conducting layer on the substrate; a semiconductor layer containing a nanosemiconductor material on the conducting layer, the gate insulating film disposed between the semiconductor layer and the gate electrode; source and drain electrodes contacting opposing sides of the semiconductor layer; a passivation layer on the substrate including the source and drain electrodes, the passivation layer having a first contact hole that exposes the drain electrode; and a pixel electrode formed in the pixel region and connected to the drain electrode through the first contact hole.

In another embodiment, an LCD device comprises: a first transparent substrate on which a ferroelectric layer and a semiconductor layer containing a nanosemiconductor material are disposed, the ferroelectric layer disposed between the semiconductor layer and the first substrate; a second transparent substrate; and liquid crystal disposed between the first and second substrates.

In another embodiment, a method for fabricating an LCD device comprises: providing a substrate having a pixel region; forming a gate electrode in the pixel region; forming a gate insulating film on the substrate; forming a conducting layer on the substrate; altering a portion of the conducting layer such that the portion has a potential of a first polarity; forming a semiconductor layer on the portion of the conducting layer by dipping the substrate provided with the altered conducting layer in a solution containing a nanosemiconductor material having a second polarity opposite to the first polarity; forming source and drain electrodes at opposing sides of the semiconductor layer; forming a passivation layer on the substrate including the source and drain electrodes; partially removing the passivation layer to form a first contact hole that exposes the drain electrode; and forming a pixel electrode in the pixel region, the pixel electrode connected to the drain electrode through the first contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
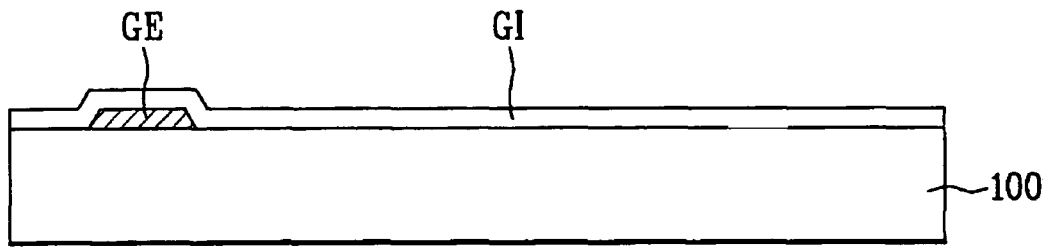
FIG. 1A to FIG. 1E are sectional views illustrating process steps of forming a semiconductor layer of a thin film transistor provided in a related art LCD device.
Figure 1B:
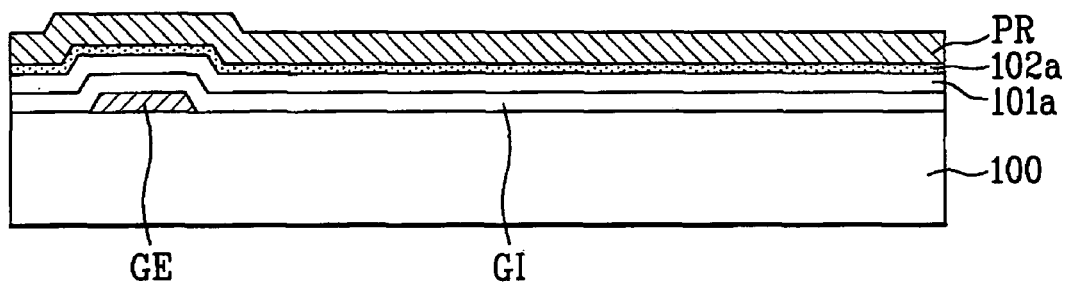
Figure 1C:
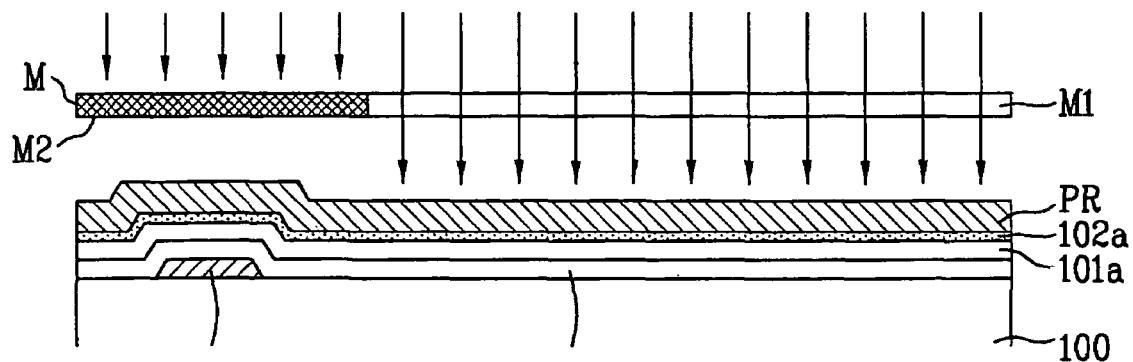
Figure 1D:
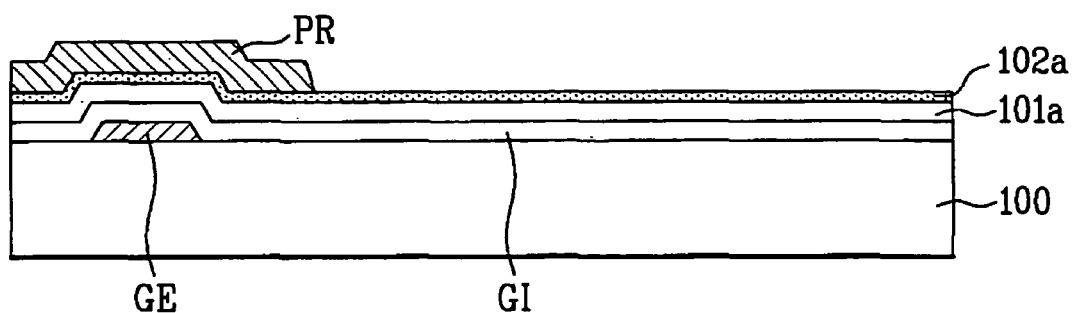
Figure 1E:
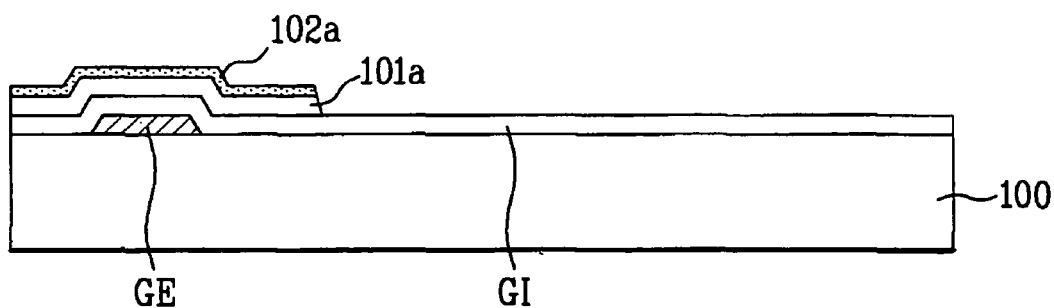
Figure 2:
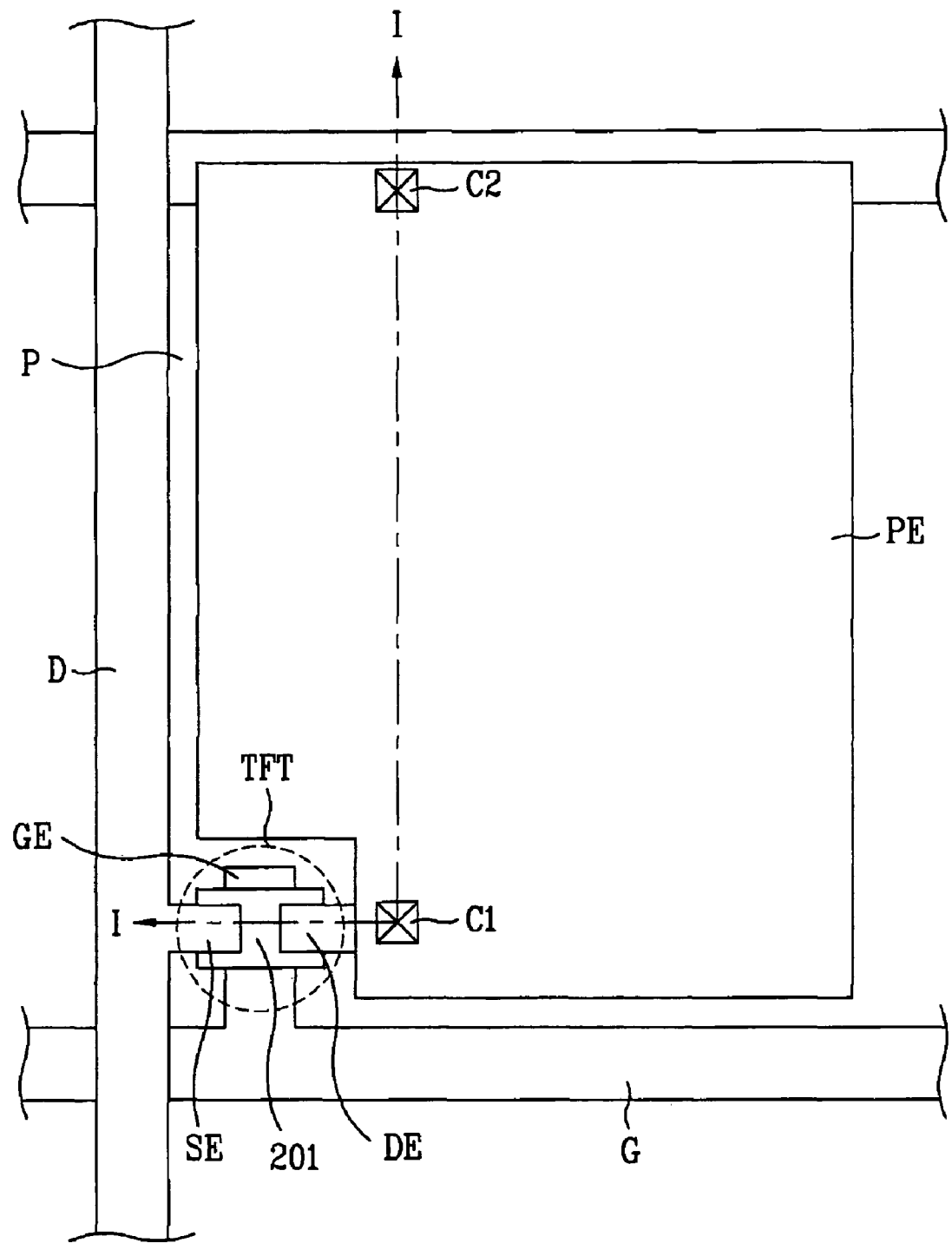
FIG. 2 is a plan view illustrating one pixel region of an LCD device according to the embodiment of the present invention.
Figure 3:
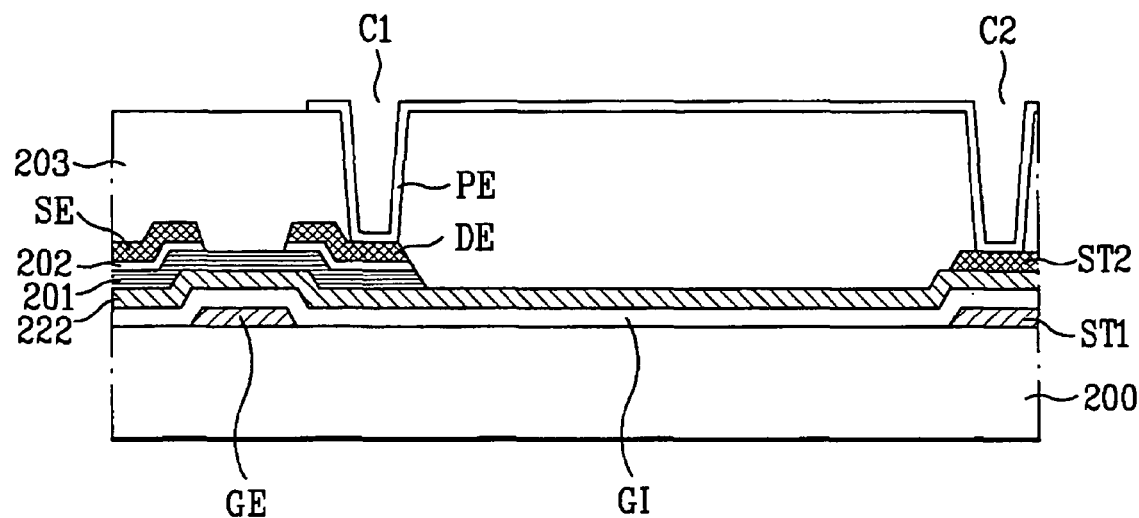
FIG. 3 is a sectional view taken along line I-I of FIG. 2.

FIG. 2 is a plan view illustrating one pixel region of an LCD device according to the embodiment of the present invention, and FIG. 3 is a sectional view taken along line I-I of FIG. 2.

As shown in FIG. 2 and FIG. 3, the LCD device according to the first embodiment of the present invention includes a substrate 200, a plurality of gate lines G arranged on the substrate 200 in a first direction, a plurality of data lines D arranged perpendicular to the gate lines G, pixel regions P defined in a matrix by the gate lines G and the data lines D, pixel electrodes PE respectively formed in the pixel regions P, and thin film transistors TFT formed at regions where the data lines D cross the gate lines G, and turned on by gate signals of the gate lines G to apply data signals of the data lines D to the pixel electrodes PE.

Each of the thin film transistors, as shown in FIG. 3, includes a gate electrode GE partially extending from the gate line G into the pixel region P, a gate insulating film GI formed on the gate electrode GE, an island shaped semiconductor layer 201 on the gate insulating film GI to overlap the gate electrode GE, an ohmic contact layer 202 formed at both sides of the semiconductor layer 201, and source and drain electrodes SE and DE formed on the ohmic contact layer 202.

Meanwhile, the pixel electrode PE formed in one of the pixel regions P is partially overlapped with the gate line G of another pixel region P adjacent to the pixel region P, so that a storage capacitor is formed.

In other words, some of the gate insulating film GI formed between a first storage electrode ST1 corresponding to some of the gate line G and a second storage electrode ST2 corresponding to some of the pixel electrode PE serves as the storage capacitor.

The semiconductor layer 201 is made of a nanosemiconductor material 400. The nanosemiconductor material 400 is a nanotube, a nanowire, and/or a nanorod.

Figure 4:
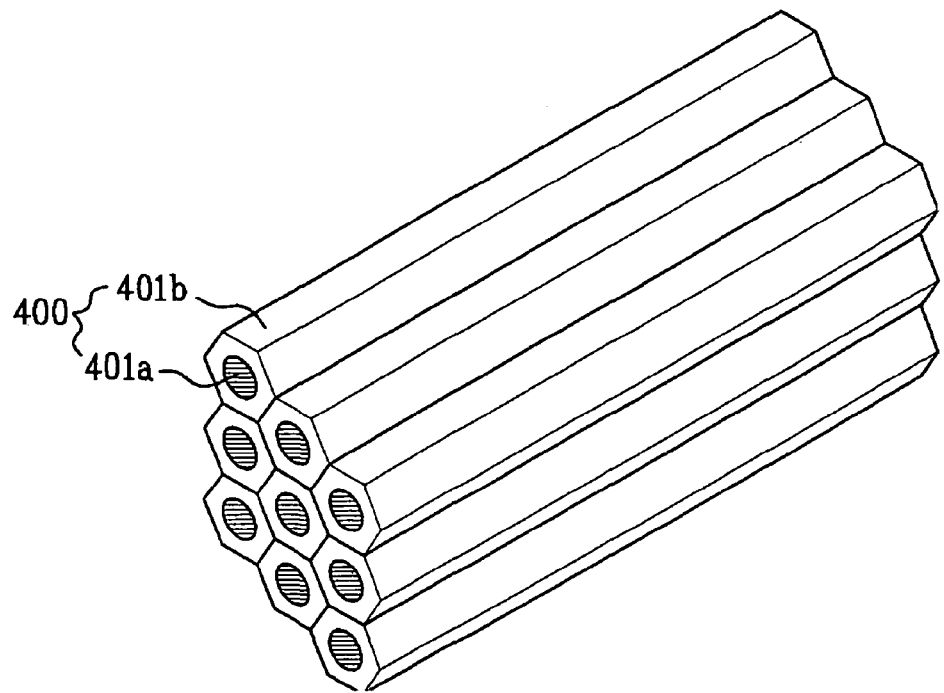
FIG. 4 illustrates a nanotube.

FIG. 4 illustrates a nanotube. As shown in FIG. 4, the nanotube includes a semiconductor material 401a and an insulating material 401b surrounding an outer surface of the semiconductor material 401a. Since the LCD device according to the first embodiment of the present invention uses the semiconductor layer 201 made of the above material, it has excellent electric conductivity.

A method for fabricating the LCD device according to the first embodiment of the present invention will be described.

FIG. 5A to FIG. 5F are sectional views illustrating process steps of fabricating the LCD device according to the first embodiment of the present invention.

Figure 5A:
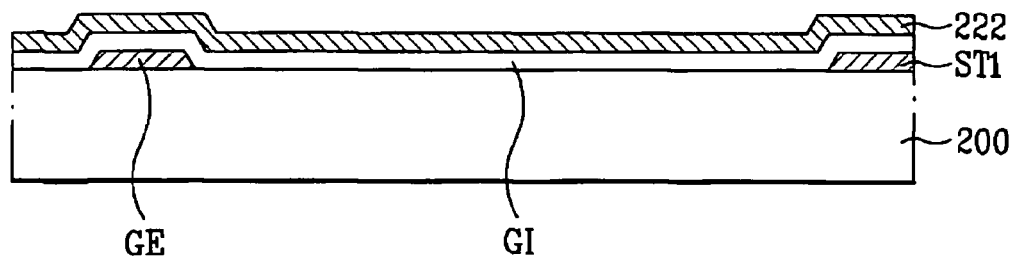
FIG. 5A to FIG. 5J are sectional views illustrating process steps of fabricating an LCD device according to the first embodiment of the present invention.

As shown in FIG. 5A, a substrate 200 defined by a plurality of pixel regions P is prepared, and a metal is deposited on an entire surface of the substrate 200. The metal is then selectively patterned by a photolithographic process to form a gate line G and a gate electrode GE extending from the gate line into the pixel regions P.

At this time, some of the gate line G in adjacent pixel regions P is formed as the first storage electrode ST1 in a storage region of the pixel regions P.

Subsequently, a gate insulating film GI including an insulating material such as $SiO_2$ or $SiN_x$ is deposited on the entire surface of the substrate 200 including the gate line G, the gate electrode GE and the first storage electrode ST1.

Afterwards, a conducting layer 222 is formed on the entire surface of the substrate 200 including the gate insulating film GI. A ferroelectric material may be used as the conducting layer 222.

Figure 5B:
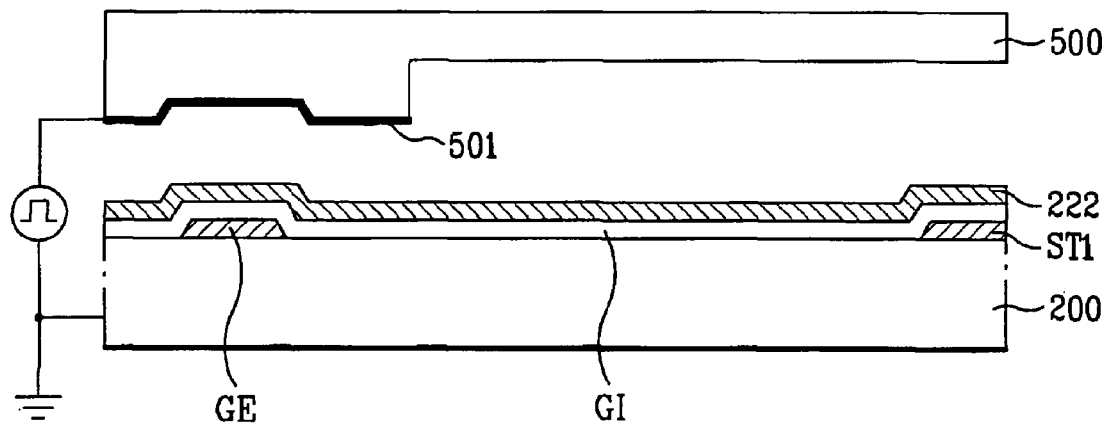

As shown in FIG. 5B, a mold 500 is aligned above the substrate 200 in which the conducting layer 222 is formed. A metal pattern layer 501 is formed underneath the mold 500 to oppose the conducting layer 222. The metal pattern layer 501 is selectively formed at only a portion where the semiconductor layer 201 is to be arranged.

Figure 5C:
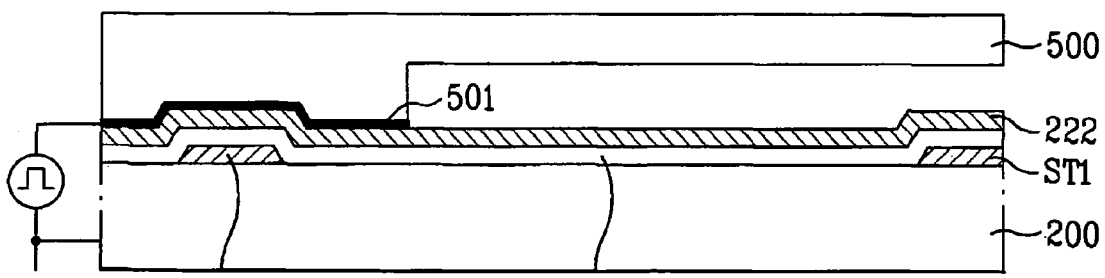
Figure 5D:
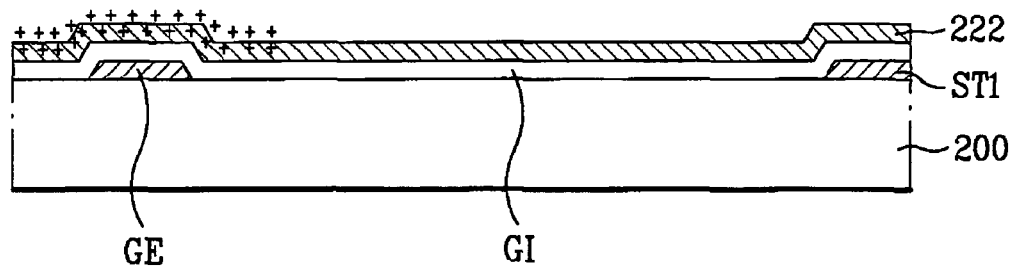

Next, as shown in FIG. 5C, the mold 500 descends toward the substrate 200. The metal pattern layer 501 selectively contacts some of the conducting layer 222, i.e., the portion where the semiconductor layer 201 is to be arranged. An electric signal is applied between the metal pattern layer 501 and the substrate 200, generating an electrostatic phenomenon between the metal pattern layer 501 and the conducting layer 222. Only the conducting layer 222 corresponding to the metal pattern layer 501 is affected by the electrostatic phenomenon such that, as shown in FIG. 5D, some of the conducting layer 222 has a positive potential.

Figure 5E:
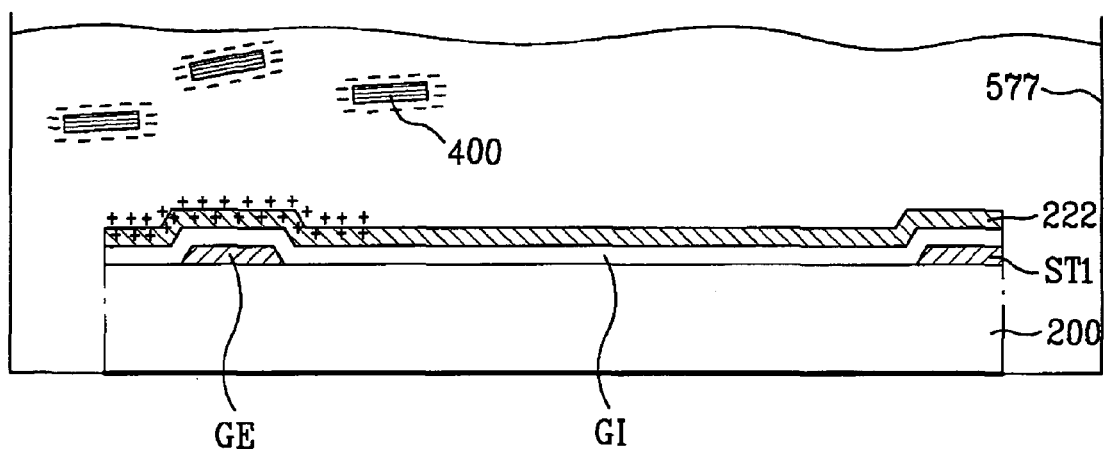

Subsequently, as shown in FIG. 5E, the substrate 200 in which the conducting layer 222 is formed is dipped in a water tank 577 containing the nanosemiconductor material 400. The water tank 577 contains a solution. The nanosemiconductor material 400 floats in the solution. The nanosemiconductor material 400 has a negative potential.

If the substrate 200 is dipped in the solution containing the nanosemiconductor material 400, the nanosemiconductor material 400 in the solution is attached to only the portion where the conducting layer 222 has the positive potential.

Figure 5F:
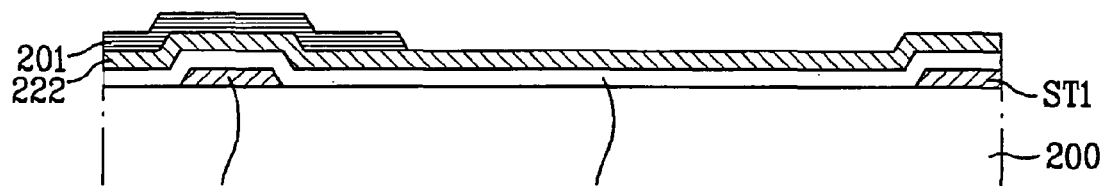

Then, as shown FIG. 5F, the semiconductor layer 201 consisting of the nanosemiconductor material 400 is formed at some of the conducting layer 222.

Figure 5G:
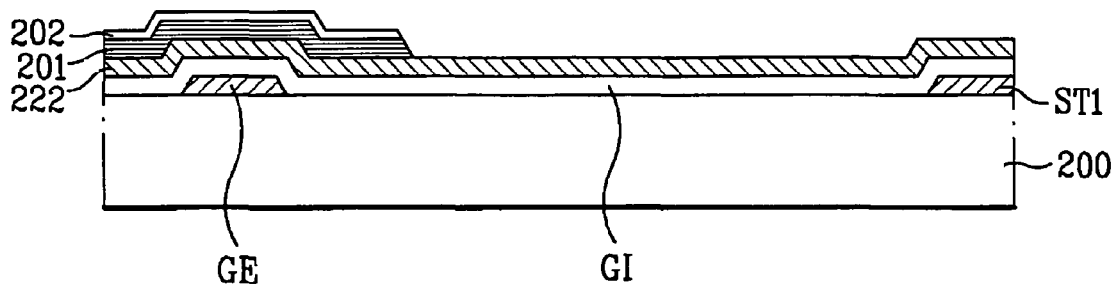

Subsequently, the substrate 200 in which the semiconductor layer 201 is formed is unloaded from the water tank 577. Afterwards, as shown in FIG. 5G, doped semiconductor material such as amorphous silicon is deposited on the conducting layer 222 of the substrate 200 and then patterned by a photolithographic process to form the ohmic contact layer 202 on the conducting layer 222 above the gate electrode GE.

Figure 5H:
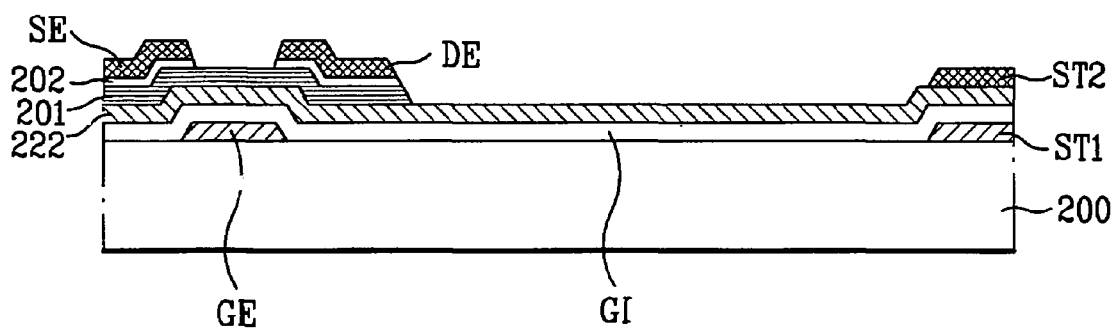

Next, as shown in FIG. 5H, a metal layer such as Cr or Mo is deposited on the entire surface of the substrate 200 including the semiconductor layer 201 and the ohmic contact layer 202 and then patterned by the photolithographic process to form source and drain electrodes SE and DE at both sides of the semiconductor layer except a channel region. Thus, the thin film transistor is completed. The data line D connected to the source electrode SE and vertical to the gate line G is formed, and the second storage electrode ST2 is formed on the gate insulating film GI positioned on the first storage electrode ST1 of the storage region.

At this time, the ohmic contact layer 202 formed on the channel region of the semiconductor layer 201 is partially removed.

Figure 5I:
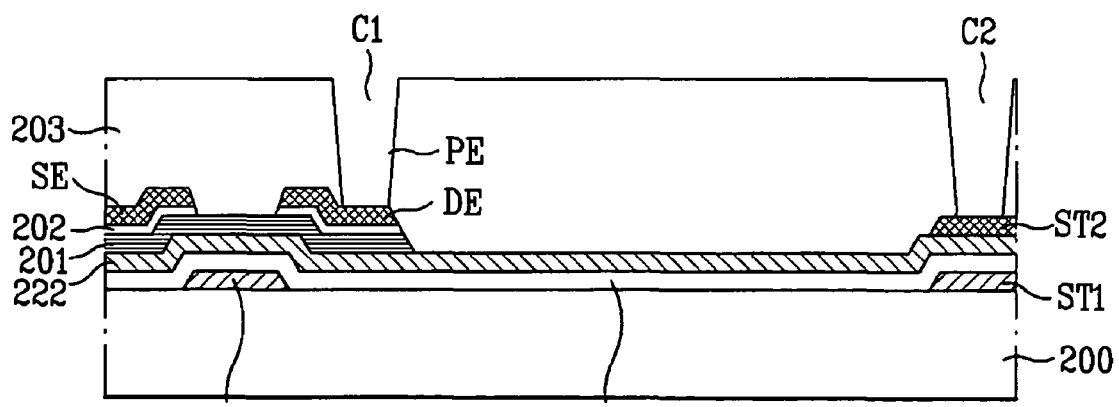

Subsequently, as shown in FIG. 5I, a passivation layer 203 of an organic insulating film is deposited on the entire surface of the substrate 200 including the source electrode SE, the drain electrode DE, the second storage electrode ST2, and the gate insulating film GI. The passivation layer 203 is then patterned by the photolithographic process to simultaneously form a first contact hole C1 and a second contact hole C2. The first contact hole C1 partially exposes the drain electrode DE while the second contact hole C2 partially exposes the second storage electrode ST2.

Figure 5J:
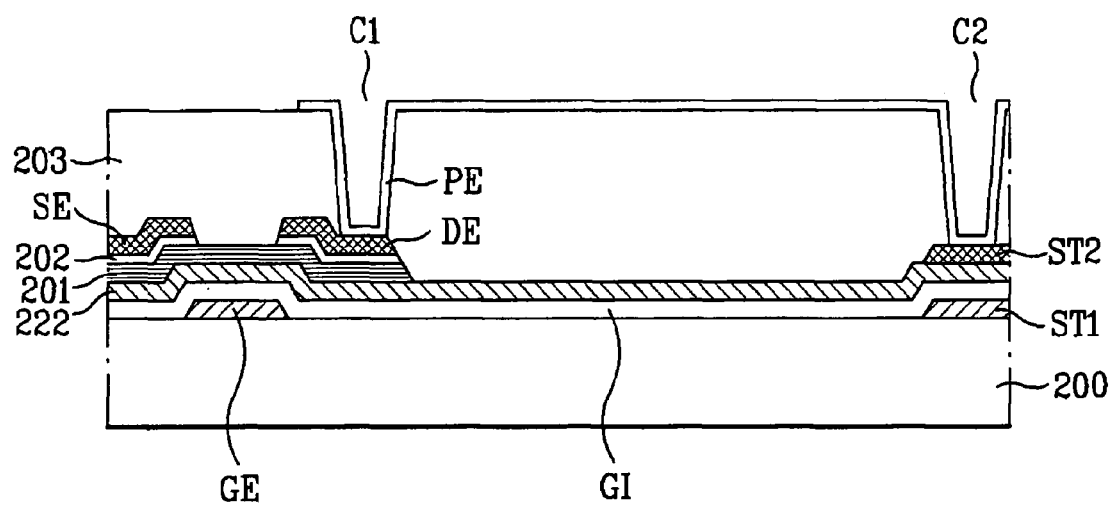

Afterwards, as shown in FIG. 5J, a transparent conductive film is deposited on the entire surface of the passivation layer 203 and then patterned by the photolithographic process to form the drain electrode DE and the pixel electrode PE through the first contact hole C1 and the second contact hole C2. The pixel electrode PE is electrically connected to the second storage electrode ST2.

In the aforementioned method for fabricating the LCD device according to the first embodiment of the present invention, the nanosemiconductor material is used as the semiconductor layer 201, and the semiconductor layer 201 is formed by the electric phenomenon of the nanosemiconductor material 400. In this case, the existing complicated process steps can be reduced.

Meanwhile, although the thin film transistor according to the first embodiment of the present invention is fabricated based on a bottom gate mode device, it may be fabricated based on a top gate mode device.

An LCD device according to the second embodiment of the present invention will be described.

Figure 6:
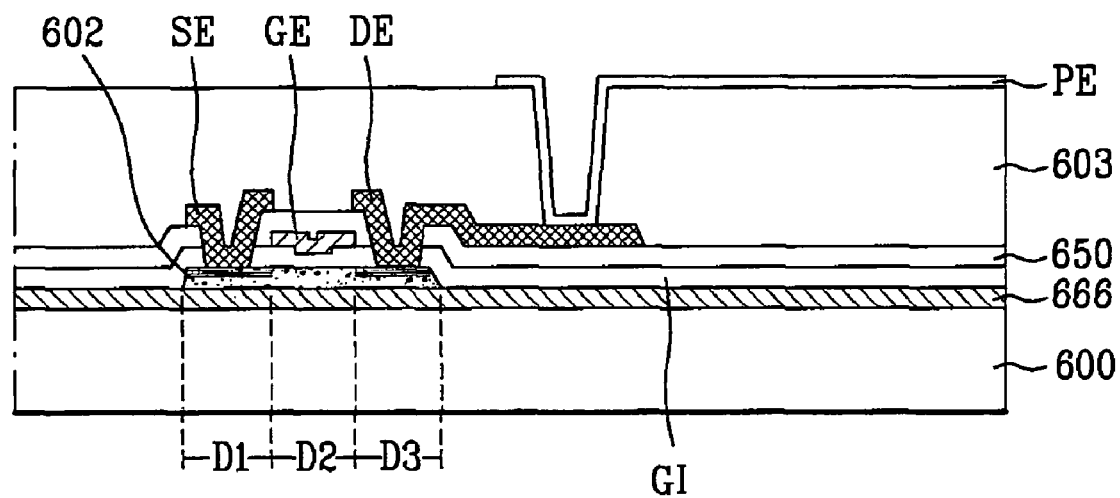
FIG. 6 is a plane view illustrating one pixel region of an LCD device according to the second embodiment of the present invention.

FIG. 6 is a plane view illustrating one pixel region of an LCD device according to the second embodiment of the present invention.

As shown in FIG. 6, the LCD device according to the second embodiment of the present invention includes a substrate 600 having a plurality of pixel regions P, a conducting layer 666 formed on an entire surface of the substrate 600, a semiconductor layer 601 formed on the conducting layer 666 corresponding to the pixel regions P, a gate insulating film GI formed on the entire surface of the substrate 600 including the semiconductor layer 601, having a first contact hole C1 and a second contact hole C2, the first contact hole C1 exposing a source region D1 of the semiconductor layer 601 and the second contact hole C2 exposing a drain region D3 of the semiconductor layer 601, a gate electrode GE formed on the gate insulating film GI above a channel region D2 of the semiconductor layer 601, an interlayer insulating film 650 formed on the entire surface of the substrate 600 including the gate electrode GE, having the first contact hole C1 and the second contact hole C2, a source electrode SE connected to the source region D1 through the first contact hole C1, a drain electrode DE connected to the drain region D3 through the second contact hole C2, a passivation layer 603 formed on the entire surface of the substrate 600 including the source and drain electrodes SE and DE, having a third contact hole that exposes the drain electrode DE, and a pixel electrode PE connected to the drain electrode DE through the third contact hole C3.

The semiconductor layer 601 is formed of the nanosemiconductor material 400. Since the LCD device according to the second embodiment of the present invention uses the semiconductor layer 601 made of the above material, it has excellent electric conductivity.

Meanwhile, although not shown, the LCD device according to the second embodiment of the present invention further includes a first storage electrode and a second storage electrode. The first storage electrode is formed on the conducting layer 666 corresponding to the storage region of the substrate 600. The first storage electrode is electrically connected to the pixel electrode PE through a fourth contact hole that passes through the gate insulating film GI, the interlayer insulating film 650, and the passivation layer 603.

The second storage electrode is formed on the gate insulating film GI to overlap the first storage electrode.

A method for fabricating the aforementioned LCD device according to the second embodiment of the present invention will now be described.

FIG. 7A to FIG. 7G are sectional views illustrating process steps of fabricating the LCD device according to the second embodiment of the present invention.

Figure 7A:
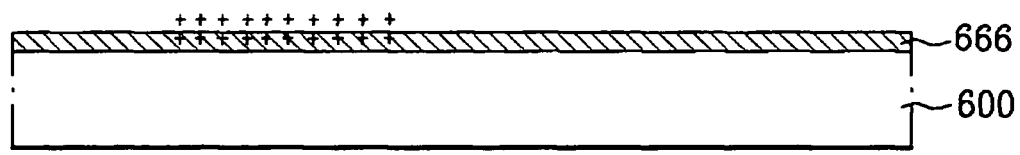
FIG. 7A to FIG. 7G are sectional views illustrating process steps of fabricating an LCD device according to the second embodiment of the present invention.

As shown in FIG. 7A, the conducting layer 666 is formed on the entire surface of the substrate 600. The conducting layer is formed of the same material as that of the first embodiment. A part of the conducting layer 666 is then given a positive potential by the process described in the first embodiment.

Figure 7B:
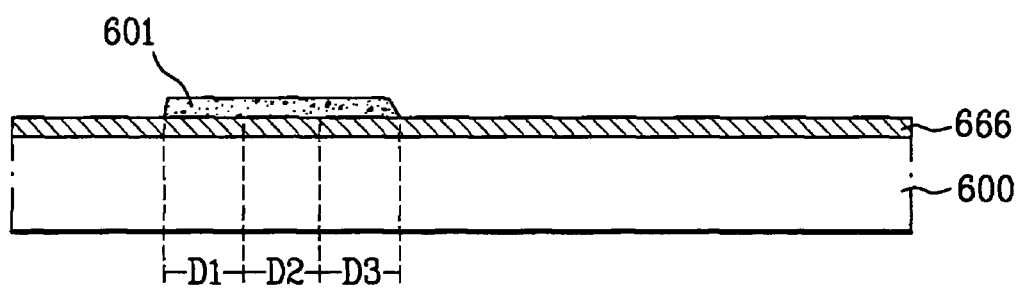

Afterwards, as shown in FIG. 7B, the semiconductor layer 601 is formed on the conductive portion of the conducting layer 666.

Figure 7C:
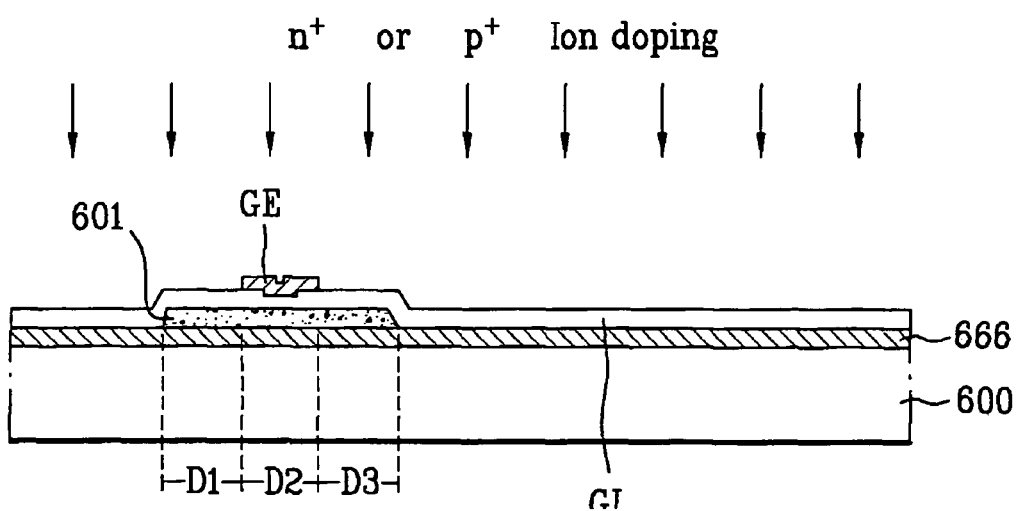

As shown in FIG. 7C, one or more materials selected from an inorganic material group including $SiN_X$ or $SiO_2$ are deposited on the entire surface of the substrate 600 including the semiconductor layer 601 to form the gate insulating film GI.

Next, one selected from a conductive metal group including Al, AlNd, Cr, W, Mo, Ti, and Ta is deposited on the entire surface of the substrate 600 in which the gate insulating film GI is formed, and then patterned by the photolithographic process to form the gate electrode GE on the gate insulating film GI to correspond to the channel region D2 of the semiconductor layer 601.

At this time, although not shown, the gate line G connected with the gate electrode GE is formed along with the gate electrode GE.

Next, n+ ions or p+ ions are injected into both sides of the semiconductor layer 601 using the gate electrode GE as a mask to form the source region D1 and the drain region D3 at both sides of the semiconductor layer 601.

Figure 7D:
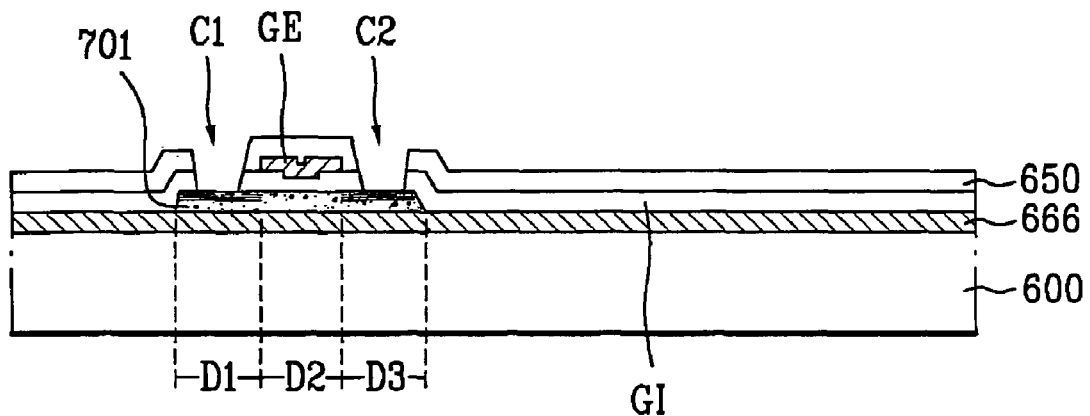
Figure 7E:
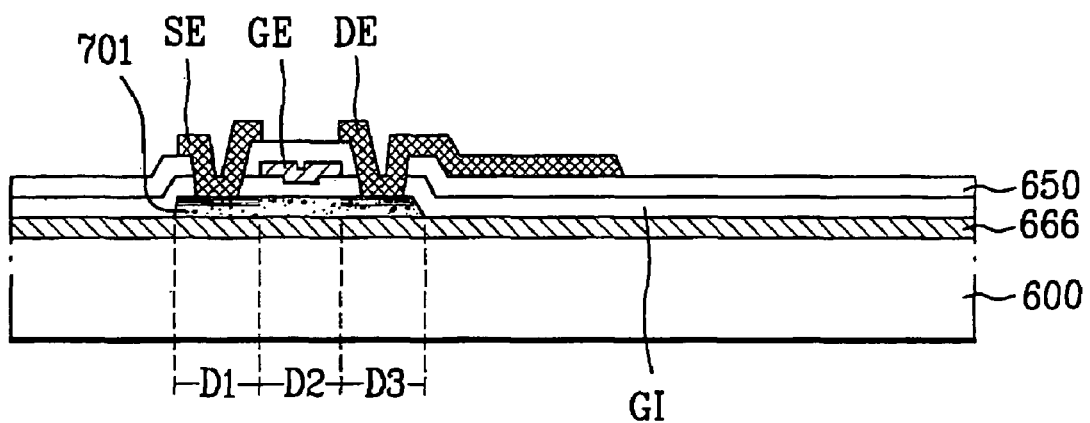

Subsequently, as shown in FIG. 7D, one or more materials selected from an inorganic material group including $SiN_x$ or $SiO_2$ are deposited on the entire surface of the substrate 600 in which the gate electrode GE is formed, to form the interlayer insulating film 650.

Afterwards, the interlayer insulating film 650 and the gate insulating film GI below the interlayer insulating film 650 are etched to form the first contact hole C1 and the second contact hole C2. The first contact hole C1 exposes the source region D1 of the semiconductor layer 601 while the second contact hole C2 exposes the drain region D3 of the semiconductor layer 601.

Next, a material selected from a conductive metal group including Al, AlNd, Cr, W, Mo, Ti, and Ta is deposited on the entire surface of the substrate 600 including the interlayer insulating film 650 and then patterned by the photolithographic process to form the source electrode SE and the drain electrode DE. The source electrode SE is connected to the source region D1 of the semiconductor layer 601 through the first contact hole C1, and the drain electrode DE is connected to the drain region D3 through the second contact hole C2.

Figure 7F:
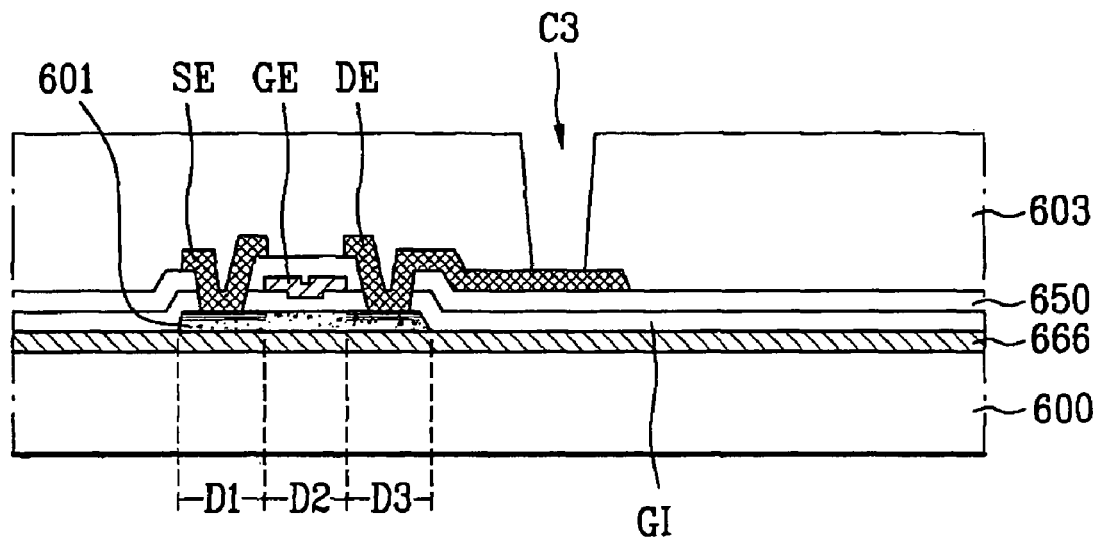
Figure 7G:
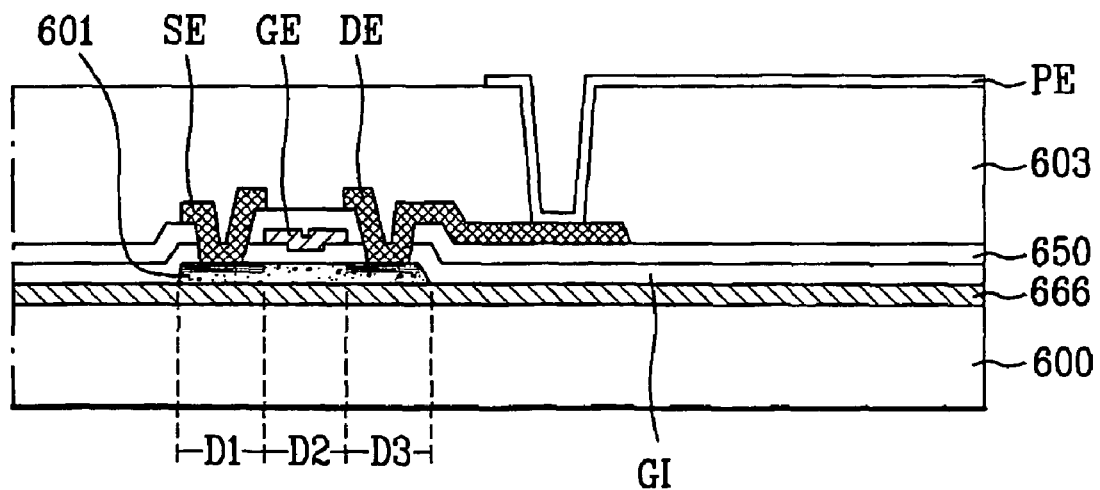

Subsequently, as shown in FIG. 7F, one or more materials selected from an inorganic material group including $SiN_x$ or $SiO_2$ are deposited on the entire surface of the substrate 600 in which the source and drain electrodes SE and DE are formed, to form the passivation layer 603. At this time, a material selected from an organic material group including BCB or acrylic resin may be deposited on the entire surface of the substrate 600 as desired.

Next, the passivation layer 603 is patterned by the photolithographic process to form the third contact hole C3 that partially exposes the drain electrode DE.

Afterwards, a material selected from a transparent conductive metal group including ITO or IZO is deposited on the entire surface of the substrate 600 including the passivation layer 603 and then patterned by the photolithographic process to form the pixel electrode PE connected to the drain electrode DE through the third contact hole.

Meanwhile, although not shown, the first storage electrode and the second storage electrode may further be formed in the storage region of the substrate 600. The first storage electrode is formed of the same material as that of the semiconductor layer 601. The first storage electrode is formed simultaneously with the semiconductor layer 601 by the same process as that of the semiconductor layer 601. The first storage electrode is connected to the pixel electrode PE. To this end, the fourth contact hole is formed to partially expose the first storage electrode by passing through the gate insulating film GI, the interlayer insulating film 650, and the passivation layer 603.

The second storage electrode is formed on the gate insulating film GI to overlap the first storage electrode. The second storage electrode is formed of the same material as that of the gate electrode GE. Also, the second storage electrode is formed simultaneously with the gate electrode GE by the same process as that of the gate electrode GE.

As described above, the use of a nanomaterial semiconductor layer permits excellent electric conductivity to be obtained while using fewer and simpler process steps than the related art.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an LCD device including semiconductor of nano material comprising:
providing a thin film transistor (TFT) substrate having a pixel region;
forming a gate electrode of a thin film transistor (TFT) in the pixel region;
forming a gate insulating film on the gate electrode on the substrate;
forming a conducting layer on the gate insulating film;
altering a portion of the conducting layer such that the portion has a potential of a first polarity,
wherein altering the portion of the conducting layer comprises:
aligning a mold such that a conductive pattern on the mold is aligned above the portion of the conducting layer which corresponds to the thin film transistor (TFT),
adjusting a relative position of the mold and the substrate such that the conductive pattern directly contacts the portion of the conducting layer corresponding to the thin film transistor (TFT),
applying an electric signal between the conductive pattern and the substrate to provide the potential of the first polarity to the portion of the conducting layer,
wherein the electric signal is generated between the conductive pattern and ground, and wherein the substrate is connected to ground; and
separating the mold from the portion of the conducting layer subsequent to applying the electric field;
wherein the electric signal is generated by electric means;
wherein one electrode of the electric means is connected to the conductive pattern, and the other electrode of the electric means is connected to a ground;
wherein the substrate is connected to the ground;
forming a semiconductor layer on the portion of the conducting layer by dipping the whole substrate having the conducting layer in a solution contained in a water tank so that the conducting layer is perfectly immersed in the solution,
wherein the solution contains a plurality of nano tubes having a second polarity opposite to the first polarity, wherein the semiconductor layer forms a channel region of the TFT;
wherein each nanotube includes a semiconductor material and an insulating material surrounding an outer surface of the semiconductor material;
wherein the semiconductor material has a shape of cylinder;
forming source and drain electrodes at opposing sides of the semiconductor layer;
forming a passivation layer on the substrate including the source and drain electrodes;

partially removing the passivation layer to form a first contact hole that exposes the drain electrode: and forming a pixel electrode in the pixel region, the pixel electrode connected to the drain electrode through the first contact hole.

2. The method according to claim 1, wherein the conducting layer comprises a ferroelectric material.

3. The method according to claim 1, further comprising:

forming a first storage electrode on the substrate corresponding to a storage region of the substrate; and forming a second storage electrode on the conducting layer to overlap the first storage electrode, the second storage electrode electrically connected to the pixel electrode through a second contact hole that passes through the passivation layer.

4. The method according to claim 1, further comprising forming an ohmic contact layer between the semiconductor layer and the source and drain electrodes.

5. The method according to claim 1, wherein the gate electrode is disposed between the semiconductor layer and the substrate.

* * * * *